(12) United States Patent
Bindeman

(10) Patent No.: US 7,392,163 B1
(45) Date of Patent: Jun. 24, 2008

(54) METHOD AND SYSTEM FOR CONTROLLING HOURGLASS DEFORMATIONS OF SOLID ELEMENTS IN FINITE ELEMENT ANALYSIS

(75) Inventor: Lee Bindeman, Oakland, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 685 days.

(21) Appl. No.: 10/810,355

(22) Filed: Mar. 25, 2004

(51) Int. Cl.
G06F 17/10 (2006.01)
(52) U.S. Cl. .................................. 703/2; 716/9; 345/420
(58) Field of Classification Search .................... 703/2; 716/9; 345/420
See application file for complete search history.

(56) References Cited

U.S. PATENT DOCUMENTS

| | | | | |
|---|---|---|---|---|
| 6,044,210 | A * | 3/2000 | Nagtegaal | 716/9 |
| 6,560,570 | B1 * | 5/2003 | Dohrmann et al. | 703/7 |
| 6,697,770 | B1 * | 2/2004 | Nagetgaal | 703/2 |
| 7,027,048 | B2 * | 4/2006 | Brombolich | 345/420 |
| 2002/0198693 | A1 * | 12/2002 | Marusich | 703/2 |

OTHER PUBLICATIONS

Forssell et al., Feb. 14, 2003, "Creating a New Element Type", http://web.archive.org/web/20030214185408/http://impact.sourceforge.net/Manual_Programmers/Element.html.*

Belytschko, 1997, Element Technology, http://www.tam.northwestern.edu/tb/Book/Chapter%208.pdf.*

Thomas J.R.; "The Finite Element Method Linear Static and Dynamic Finite Element Analysis" p. 123-125, 2000, Dover Publications.*

Li et al., "An 8-node brick element with mixed formulation for large deformation analyses", Computer Methods in Applied Mechanics and Engineering, vol. 141, Issue 1-2, Feb. 1997, pp. 157-204.*

T. Belytschko, L.P. Bindeman, Assumed strain stabilization of the 4-node quadrilateral with 1-point quadrature for nonlinear problems, 1991, North-Holland.

T. Belytschko, L.P. Bindeman, Assumed strain stabilization of the eight node hexahedral element, Computer methods in applied mechanics and engineering 105(1993), North-Holland.

* cited by examiner

*Primary Examiner*—Kamini S. Shah
*Assistant Examiner*—Herng-der Day
(74) *Attorney, Agent, or Firm*—Roger Chu

(57) ABSTRACT

Hourglass deformations due to zero-energy or hourglass modes in rank-deficient solid elements must be effectively controlled, or the deformations may grow large and produce an unrealistic deformed geometry. Traditional methods of hourglass control allow error to accumulate by measuring hourglass deformation with incremental terms throughout a solution, which may produce inaccurate results due to unrealistic hourglass deformations. The present invention discloses a new method to control hourglass deformation without any incremental accumulations. Instead the nodal forces to resist hourglass deformations are calculated basing on the initial nodal coordinates and current nodal coordinates at each cycle. The present invention is implemented in a finite element software product.

15 Claims, 13 Drawing Sheets

$$\overline{\gamma}_{\alpha I} = \Gamma_{\alpha I} - \sum_{i=1}^{3}\left(\overline{B}_{il}\sum_{J=1}^{8}\overline{X}_{iJ}\Gamma_{\alpha J}\right) \quad 510$$

$$\hat{g}_{i\alpha} = \sum_{J=1}^{8}\overline{\gamma}_{\alpha J}(\hat{x}_{iJ} - \overline{X}_{iJ}) \quad 520$$

$$\overline{\gamma}_{\alpha I} = \Gamma_{\alpha I} - \sum_{i=1}^{3}\left(\overline{B}_{iI}\sum_{J=1}^{8}\overline{X}_{iJ}\Gamma_{\alpha J}\right) \quad \text{510}$$

$$\hat{g}_{i\alpha} = \sum_{J=1}^{8}\overline{\gamma}_{\alpha J}(\hat{x}_{iJ}-\overline{X}_{iJ}) \quad \text{520}$$

*FIG. 5A*

$$\hat{G}_{ii} = \mu\left[\left(\overline{H}_{jj} + \overline{H}_{kk}\right)\hat{g}_{ii} + \overline{H}_{ij}\hat{g}_{jj} + \overline{H}_{ik}\hat{g}_{kk}\right]$$

$$\hat{G}_{ij} = \frac{2\mu}{1-\nu}\left[\overline{H}_{ii}\hat{g}_{ji} + \nu\overline{H}_{ij}\hat{g}_{ij}\right]$$

$$\hat{G}_{i4} = \frac{\mu}{3}\left[\frac{2}{(1-\nu)(1-2\nu)}\overline{H}_{ii} + \overline{H}_{jj} + \overline{H}_{kk}\right]\hat{g}_{i4}$$

— 530

$$\overline{H}_{ii} = \frac{1}{3}\frac{\sum_{J=1}^{8}\xi_{jJ}\overline{X}_{jJ}\sum_{J=1}^{8}\xi_{kJ}\overline{X}_{kJ}}{\sum_{J=1}^{8}\xi_{iJ}\overline{X}_{iJ}}$$

$$\overline{H}_{ij} = \frac{1}{3}\sum_{J=1}^{8}\xi_{kJ}\overline{X}_{kJ}$$

— 535

$$\hat{f}_{i\alpha J} = \hat{G}_{i\alpha}\overline{\gamma}_{\alpha J}$$ — 540

FIG. 5B

FIG. 5C — Table 580

| j | 1 | 2 | 3 | 4 | 5 | 6 | 7 | 8 |
|---|---|---|---|---|---|---|---|---|
| $\Gamma_{1j}$ | 1 | -1 | 1 | -1 | 1 | -1 | -1 | -1 |
| $\Gamma_{2j}$ | -1 | 1 | -1 | -1 | -1 | -1 | 1 | 1 |
| $\Gamma_{3j}$ | 1 | -1 | 1 | 1 | -1 | 1 | 1 | -1 |
| $\Gamma_{4j}$ | 1 | 1 | 1 | -1 | -1 | 1 | -1 | 1 |

FIG. 5D (Prior Art) — Table 585

| j | 1 | 2 | 3 | 4 | 5 | 6 | 7 | 8 |
|---|---|---|---|---|---|---|---|---|
| $\xi_{1j}$ | -1 | 1 | 1 | -1 | -1 | 1 | 1 | -1 |
| $\xi_{2j}$ | -1 | -1 | 1 | 1 | -1 | -1 | 1 | 1 |
| $\xi_{3j}$ | -1 | 1 | -1 | 1 | 1 | 1 | 1 | 1 |

| i | j | k |
|---|---|---|
| 1 | 2 | 3 |
| 1 | 3 | 2 |
| 2 | 3 | 1 |
| 2 | 1 | 3 |
| 3 | 1 | 2 |
| 3 | 2 | 1 |

$$\gamma_j = \begin{Bmatrix} \overline{\gamma}_{j1} \\ \overline{\gamma}_{j2} \\ \overline{\gamma}_{j3} \\ \overline{\gamma}_{j4} \\ \overline{\gamma}_{j5} \\ \overline{\gamma}_{j6} \\ \overline{\gamma}_{j7} \\ \overline{\gamma}_{j8} \end{Bmatrix}$$

$$\gamma_j^T = \{\overline{\gamma}_{j1}, \overline{\gamma}_{j2}, \overline{\gamma}_{j3}, \overline{\gamma}_{j4}, \overline{\gamma}_{j5}, \overline{\gamma}_{j6}, \overline{\gamma}_{j7}, \overline{\gamma}_{j8}\}$$

$$k_{11} = \mu H_{11}\left[\frac{2}{1-\nu}\left(\gamma_2\gamma_2^T + \gamma_3\gamma_3^T\right) + \frac{2(1-\nu)}{3(1-2\nu)}\gamma_4\gamma_4^T\right]$$

$$+\mu(H_{22} + H_{33})\left(\gamma_1\gamma_1^T + \frac{1}{3}\gamma_4\gamma_4^T\right)$$

$$k_{22} = \mu H_{22}\left[\frac{2}{1-\nu}\left(\gamma_1\gamma_1^T + \gamma_3\gamma_3^T\right) + \frac{2(1-\nu)}{3(1-2\nu)}\gamma_4\gamma_4^T\right]$$

$$+\mu(H_{11} + H_{33})\left(\gamma_2\gamma_2^T + \frac{1}{3}\gamma_4\gamma_4^T\right)$$

$$k_{33} = \mu H_{33}\left[\frac{2}{1-\nu}\left(\gamma_1\gamma_1^T + \gamma_2\gamma_2^T\right) + \frac{2(1-\nu)}{3(1-2\nu)}\gamma_4\gamma_4^T\right]$$

$$+\mu(H_{11} + H_{22})\left(\gamma_3\gamma_3^T + \frac{1}{3}\gamma_4\gamma_4^T\right)$$

$$k_{12} = \mu H_{12}\left[\frac{2\nu}{1-\nu}\gamma_2\gamma_1^T + \gamma_1\gamma_2^T\right]$$

$$k_{13} = \mu H_{13}\left[\frac{2\nu}{1-\nu}\gamma_3\gamma_1^T + \gamma_1\gamma_3^T\right]$$

$$k_{23} = \mu H_{23}\left[\frac{2\nu}{1-\nu}\gamma_3\gamma_2^T + \gamma_2\gamma_3^T\right]$$

METHOD AND SYSTEM FOR CONTROLLING HOURGLASS DEFORMATIONS OF SOLID ELEMENTS IN FINITE ELEMENT ANALYSIS

BACKGROUND OF THE INVENTION

1. Field of the Invention

The present invention generally relates to method, system and software product used in structural design and analysis using finite element analysis, more particularly to control zero-energy hourglass mode deformations of solid elements in finite element analysis.

2. Description of the Related Art

Finite element analysis (FEA) is a computerized method widely used in industry to model and solve engineering problems relating to complex systems. FEA derives its name from the manner in which the geometry of the object under consideration is specified. With the advent of the modern digital computer, FEA has been implemented as FEA software. FEA software can be classified into two general types, implicit FEA software and explicit FEA software. Implicit FEA software uses an implicit equation solver to solve a system of coupled linear equations. Such software is generally used to simulate static or quasi-static problems. Explicit FEA software does not solve coupled equations but explicitly solves for each unknown assuming them uncoupled. Explicit FEA software usually uses central difference time integration which requires very small solution cycles or time steps for the method to be stable and accurate. Explicit FEA software is generally used to simulate short duration events where dynamics are important such as impact type events.

The user of FEA software creates a model of the system to be analyzed using elements. An element represents a finite region of the system. Within each element, the unknown quantity is assumed to take a simple form within the domain of the element. For explicit FEA software, the unknown quantity is usually acceleration. For implicit FEA software, the unknown quantity may be displacement, velocity, temperature, or others.

By assuming a simple form of the unknown within an element, and by using many elements, complex behaviors can be simulated within a reasonable time frame with the FEA software. One simple example is a linear spring element with the displacement at the ends of the spring as the unknown quantity. The displacement field is assumed to vary linearly along the length of the spring. Therefore, if we solve for the displacement at the ends of the spring, we can easily evaluate the displacement at any point along the spring. The compatible strain and stress fields for a linear spring element are constant over the element length and are easily evaluated from the end displacements and material properties.

The points on the element where the unknown is solved are called nodes. The linear spring has a node at each end. If we place a third node at the middle of the spring element, the displacement field could then be assumed to vary as a quadratic function and the compatible strain and stress fields would be linear. The common element types are solid elements for modeling volumes, shell elements for modeling thin parts dominated by bending, beam elements for modeling beams, and spring or truss elements for modeling springs and trusses. Each element is assigned a material type and appropriate material properties. By choosing appropriate material types and properties, metals, plastics, foams, soil, concrete, rubber, glass, fluids and many other materials can be modeled. The user must also specify the boundary conditions, loads, and initial conditions to complete the model. To accurately simulate complex system behavior, many elements are needed. Today, typical FEA models of entire automobile are made of more than 500,000 elements.

Once the model is defined, FEA software can perform a simulation of the physical behavior under the specified loading or initial conditions. FEA software is used extensively in the automotive industry to simulate front and side impacts of automobiles, occupant dummies interacting with airbags, and the forming of body parts from sheet metal. Such simulations provide valuable insight to engineers who are able to improve the safety of automobiles and to bring new models to the market more quickly.

Solid elements are typically used for modeling thick parts or solid bodies. In three dimensions, a solid element can be shaped like brick or hexahedron. The lowest order brick element has a node at each corner and is thus called the 8-node brick or hexahedral element. The 8-node brick element can be assumed to have a displacement (or other unknown) field that varies linearly along the edges between the nodes. Throughout the element domain, the displacement field has linear terms and cross terms but no quadratics or higher order terms. The compatible stress and strain fields have linear terms within the element domain. There are other types of solid elements such as the 6-node pentahedral element.

To calculate the nodal forces that are generated by the stress within an element, the calculated stress tensor is multiplied by terms that account for the element's geometry and then integrated over the domain of the element. For many materials, the stress field does not have a linear relationship to the strain field, so closed form integration is not possible. Instead, numerical integration such as Gauss-Legendre quadurature is routinely used. Numerical integration of an 8-node brick element can be done by defining two Gauss-Legendre integration points in each spatial direction for a total of 8 integration points. Such element is said to have full integration or rank sufficient integration. Full integration guarantees that all possible modes of deformation generate stress in the element. Alternatively, numerical integration of an 8-node brick element can be done with a single Gauss-Legendre integration point. Such an element is called an under-integrated or rank deficient element.

The under-integrated element is faster than the fully integrated element because only one stress evaluation is required per element per solution cycle rather than eight in a fully integrated element. This speed advantage is very noticeable in an explicit FEA solution where the stress evaluation dominates the solution time. An under-integrated element is also more robust in large deformation calculations because the terms evaluated at the integration point remain well conditioned at larger deformation. This follows directly from the location of the single point, at the element center, rather than shifted towards the corners as with the fully integrated element.

The disadvantage to numerical integration with only one integration point is that some modes of deformation do not contribute to the strain or stress field at the integration point. These modes which were originally noticed in finite difference calculations in two dimensions in the 1960's are historically called hourglass modes because of their shape as shown in FIGS. 1A and 1B. These modes are also called zero-energy modes because they do not generate any strain energy in the element. FIG. 2A shows an 8-node brick element with one integration point in the center of the element. The 8-node element has four zero-energy modes in each of three spatial directions for a total of 12. The four modes in one of the spatial directions are shown in FIG. 2B.

To use under-integrated elements in a finite element analysis, it is necessary to limit the deformation due to the zero-energy modes. Otherwise, the deformation due to these zero-energy modes may grow too large and dominate the solution. Some existing methods for controlling hourglass deformation are found in the following papers: "A Uniform Strain Hexahedron and Quadrilateral with Orthogonal Hourglass Control" by Flanagan and Belytsckko (1981); "Efficient Implementation of Quadrilaterals with High Coarse-Mesh Accuracy" by Belytschko and Bachrach (1985); and "Assumed Strain Stabilization of the Eight Node Hexahedral Element" by Belytschko and Bindeman (1993).

To be accurate for large deformation analysis, these existing hourglass control methods calculate an increment of hourglass force using the current element geometry to scale the force increments. The force increments are summed over time to obtain the total hourglass force. Because the element geometry changes during the solution, the increments of hourglass force calculations are based on a variable stiffness. This nonlinearity in the stiffness can cause residual hourglass deformation to remain in an element after some load is applied to the element and then removed. One exemplary application that demonstrates residual hourglass deformation is an automobile tire model that was used to study its behavior during skidding. The tire model was first pressed onto the road with a force to represent the weight of the vehicle. The tire model was then moved with a prescribed motion to start the tire rolling. After some time, the prescribed motion caused the rolling tire to skid. 8-node brick elements were used to model the tire tread. If we observe one element that models a small part of the tire tread, we would see it rotating with the tire. At some point, the element would contact the road and be compressed by the weight of the automobile. Because the tire is skidding, we would also see frictional forces cause shear deformation of the element. After a few moments, the rotation of the tire would cause the deformed element to separate from the road surface. With the compressive and shear loading removed, we would expect the element to spring back to its undeformed geometry. However, after a few rotations of the tire, we observed the brick elements of the tread failing to spring back to their undeformed geometries.

It is therefore desirable to have a new method to control hourglass deformations for solid elements in the applications that the traditional methods do not work well.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

According to one aspect of the present invention, the calculation of a set of nodal forces to resist hourglass deformation of solid elements can be summarized by the following exemplary procedure for a single 8-node solid brick element during a particular solution cycle: 1) Establish the initial element coordinate system using the global coordinates of the nodes of the initially underformed element; 2) Establish the current element coordinate system using the global coordinates of the nodes of the current deformed element; 3) Calculate initial nodal coordinates by transforming the coordinates of the nodes of the initially undeformed element from the global coordinate system to the initial element coordinate system; 4) Calculate current nodal coordinates by transforming the coordinates of the nodes of current deformed element from the global coordinate system to the current element coordinate system; 5) Evaluate the hourglass shape vectors using the initial nodal coordinates, the hourglass base vectors, and the derivatives of the tri-linear solid element shape functions which are also based on the initial nodal coordinates; 6) Calculate the magnitude of hourglass deformation of all hourglass modes using hourglass shape vectors, the initial nodal coordinates, and current nodal coordinates; 7)

Evaluate generalized hourglass forces using the magnitude of the hourglass deformation, the initial nodal coordinates, and material constants such as Possion's ratio and shear modulus of the element; 8) Calculate a set of nodal forces to resist hourglass deformation using the generalized hourglass forces and the hourglass shape vectors; 9) Transform the set of nodal forces from the current element coordinate system to the global coordinate system and add to the global force array at corresponding nodes.

According to another aspect of the present invention, the calculation of an element stabilization matrix added to the rank-deficient element stiffness matrix such that sum of the matrices is rank-sufficient can be summarized by the following exemplary procedure for a single 8-node solid brick element during a particular solution cycle: 1) Establish the initial element coordinate system using the global coordinates of the nodes of the initially underformed element; 2) Establish the current element coordinate system using the global coordinates of the nodes of the current deformed element; 3) Calculate initial nodal coordinates by transforming the coordinates of the nodes of the initially undeformed element from the global coordinate system to the initial element coordinate system; 4) Calculate current nodal coordinates by transforming the coordinates of the nodes of current deformed element from the global coordinate system to the current element coordinate system; 5) Evaluate the hourglass shape vectors using the initial nodal coordinates, the hourglass base vectors, and the derivatives of the tri-linear solid element shape functions which are also based on the initial nodal coordinates; 6) Calculate all terms of the element stabilization matrix using the hourglass shape vectors, initial nodal coordinates, and elastic material constants for the element, such as Poisson's ratio and shear modulus. 7) Transform the element stabilization matrix from the initial element coordinate system to the global coordinate system before adding it to the global stiffness matrix.

According to yet another aspect of the present invention, the set of nodal forces to resist hourglass deformation is designed to return to zero when the hourglass deformation returns to zero. In the exemplary tire simulation, this allows the tire to spring back to its initial geometry for any number of tire rotations. The present invention calculates the hourglass deformation by directly comparing the current geometry with the initial geometry. With this method, error cannot accumulate over time and elements can always spring back to their initial shape.

According to yet another aspect of the present invention, an embedded coordinate system is defined to transform and rotate with the element. This allows any amount of rigid body translation and rotation of the element to occur without affecting the hourglass deformation measure.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 5A to 5E are the formulas and tables for calculating the nodal hourglass forces of an exemplary three-dimensional 8-node brick element.

FIGS. 5F to 5H are the formulas for evaluating the stabilization matrix for an exemplary 8-node brick element.

DETAILED DESCRIPTION OF THE PREFERRED EMBODIMENTS

Figure 1B:
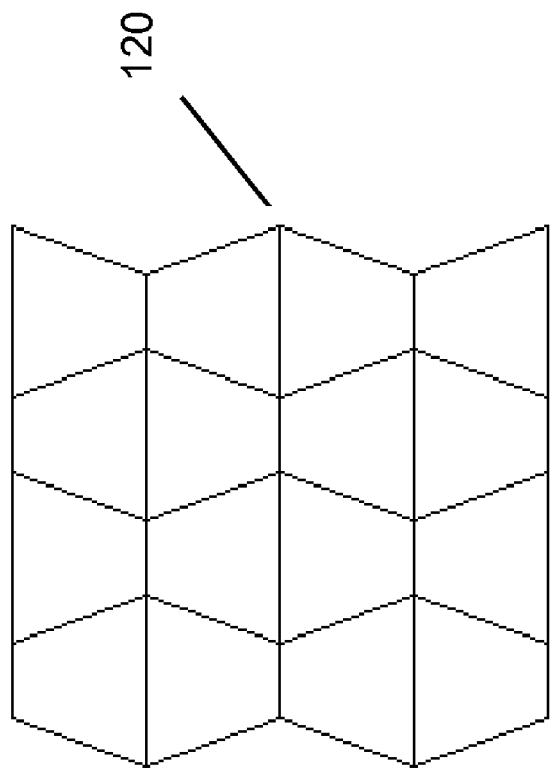
FIGS. 1A and 1B illustrate an exemplary hourglass mode of a two-dimensional finite element.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

Implicit FEA refers to the use of an implicit solver to solve coupled linear equations for the unknowns. Frequently, this takes the form $K\ x=F$, where K is the global stiffness matrix, x is the unknown displacement array and F is the global force array.

Explicit FEA refers to the way the acceleration values of each node are solved directly or explicitly for each degree of freedom. This takes the form $M\ a=F$, where M is the mass array, a is the acceleration array and F is the global force array. The equations are uncoupled by assuming that the mass array is non-zero terms only on the diagonal.

Time domain analysis refers to a FEA that simulates a physical phenomenon in time domain.

Dynamic analysis refers to a FEA that accounts for the mass and inertia effects of a structure. In general, there are two classes of dynamic analysis: time domain and frequency domain.

Solution cycle and cycle are used interchangeably to refer to the numbered solution states starting with cycle 0 at time 0.

The time step refers to an interval of time between subsequent cycles.

Two-dimensional solid element refers to 4-node 2D continuum element, such as plane strain and axisymmetric element.

Three-dimensional solid element refers to finite element such as 8-node hexahedral element, 6-node pentahedral element.

Global coordinate system refers to the coordinate system used to define the FEA model.

Initial element coordinate system refers to a local coordinate system affixed to the element based on the element's initial undeformed geometry at cycle 0.

Current element coordinate system refers to a local coordinate system affixed to the element based on the element's current deformed geometry at current cycle.

Initial nodal coordinates refer to coordinates of the node for the undeformed geometry at cycle 0.

Current nodal coordinates refer to the nodal coordinates for the deformed geometry at the current cycle.

Integration point refers to the particular location within a finite element that is used for numerical integration during the element force evaluation.

Mode shape refers to fundamental vibration mode shapes in a dynamic analysis.

Zero-energy modes and Hourglass modes are interchangeable in this specification.

Embodiments of the present invention are discussed herein with reference to FIGS. 1-6. However, those skilled in the art will readily appreciate that the detailed description given herein with respect to these figures is for explanatory purposes as the invention extends beyond these limited embodiments.

Figure 1A:
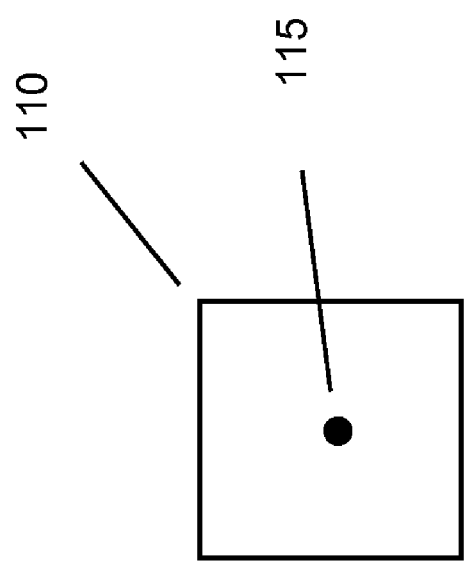

Referring now to the drawings, FIG. 1A shows a two-dimensional (2D) finite element 110 with one integration point 115 at the center of the element. FIG. 1B shows a plurality of 2D finite elements 120 demonstrating the zero-energy mode of deformation. The shape formed by two adjacent elements resembles an hourglass, which motivated the naming of hourglass modes.

Figure 2A:
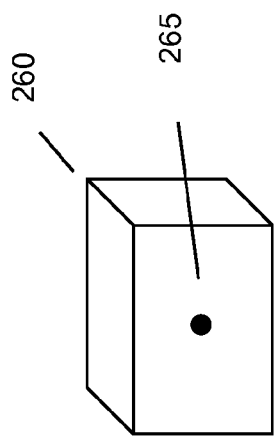
FIGS. 2A and 2B show four exemplary zero-energy modes of a three-dimensional 8-node brick element.
Figure 2B:
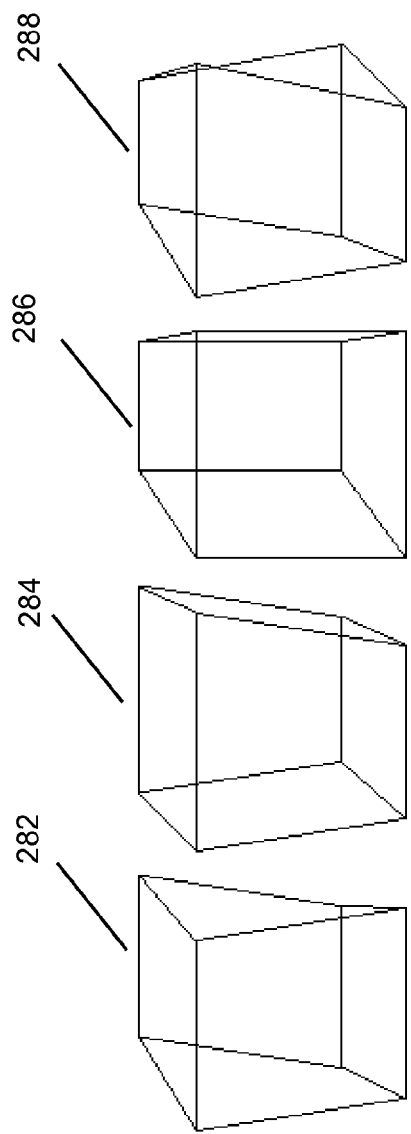

FIG. 2A shows an exemplary three-dimensional (3D) 8-node brick element 260 with one integration point 265 in the center of the element. FIG. 2B shows the four zero-energy modes 282, 284, 286 and 288 in one of the spatial directions for the 3D 8-node brick element. These modes are frequently called hourglass modes although not all the zero-energy modes of the 3D 8-node brick element resemble an hourglass.

Figure 3:
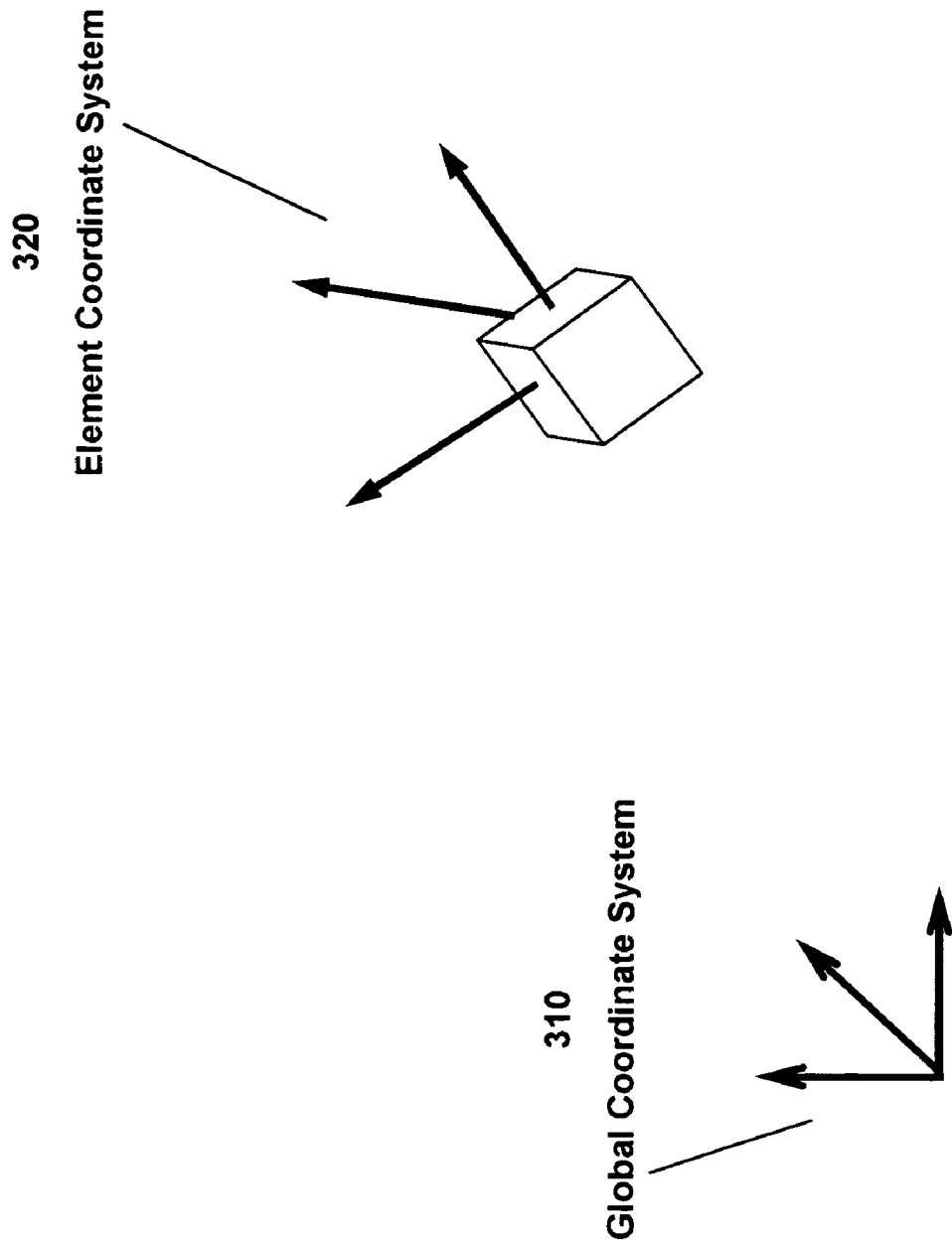
FIG. 3 depicts the relationship between the global coordinate system and an element coordinate system.

Referring now to FIG. 3, two coordinate systems used in the present invention are shown. The global coordinate system 310 is used for defining the overall FEA model geometry. The element coordinate system 320 is embedded in the element. Both of these coordinate systems are Cartesian coordinate systems having three orthogonal axes representing three spatial directions for the three dimensional space. The element coordinate system is a local coordinate system that is defined for each solid element in terms of the nodal coordinates. The initial element coordinate system is defined as the element coordinate system calculated using the initial coordinates of the nodes at the cycle 0. During a simulation, the locations of the nodes are updated each cycle if the element becomes deformed and undergoes translation and rotation. The element coordinate system is recalculated at each solution cycle so that it translates and rotates with the element. At a particular cycle, the element coordinate system defined by the nodal coordinates during that cycle is referred as the current element coordinate system.

In one embodiment, calculating the element coordinate system of an 8-node brick element uses the following procedure: 1) a trial element coordinate system is first aligned with the axes connecting the centers of opposite faces of the 8-node brick element; 2) an iterative scheme is then applied to impose orthogonality on the element coordinate system. In each iteration, a new trial coordinate system is defined as the average direction of the previous trial coordinate system and the cross product of the other two previous trial coordinate system axes. When the dot product of each new trial system axis with the previous trial system axis is nearly one, the iterations are stopped and the element coordinate system is assumed to be the final trial system.

In another embodiment, by assuming that a 6-node pentahedral element is actually an 8-node hexahedral element with a collapsed face and two pairs of coincident nodes, the element coordinate system of a 6-node pentahedral element is formed in exactly the same was as described for the 8-node hexahedral element. The transformation between the global coordinate system and the element coordinate system comprises a rotational and a translational operation.

Figure 4A:
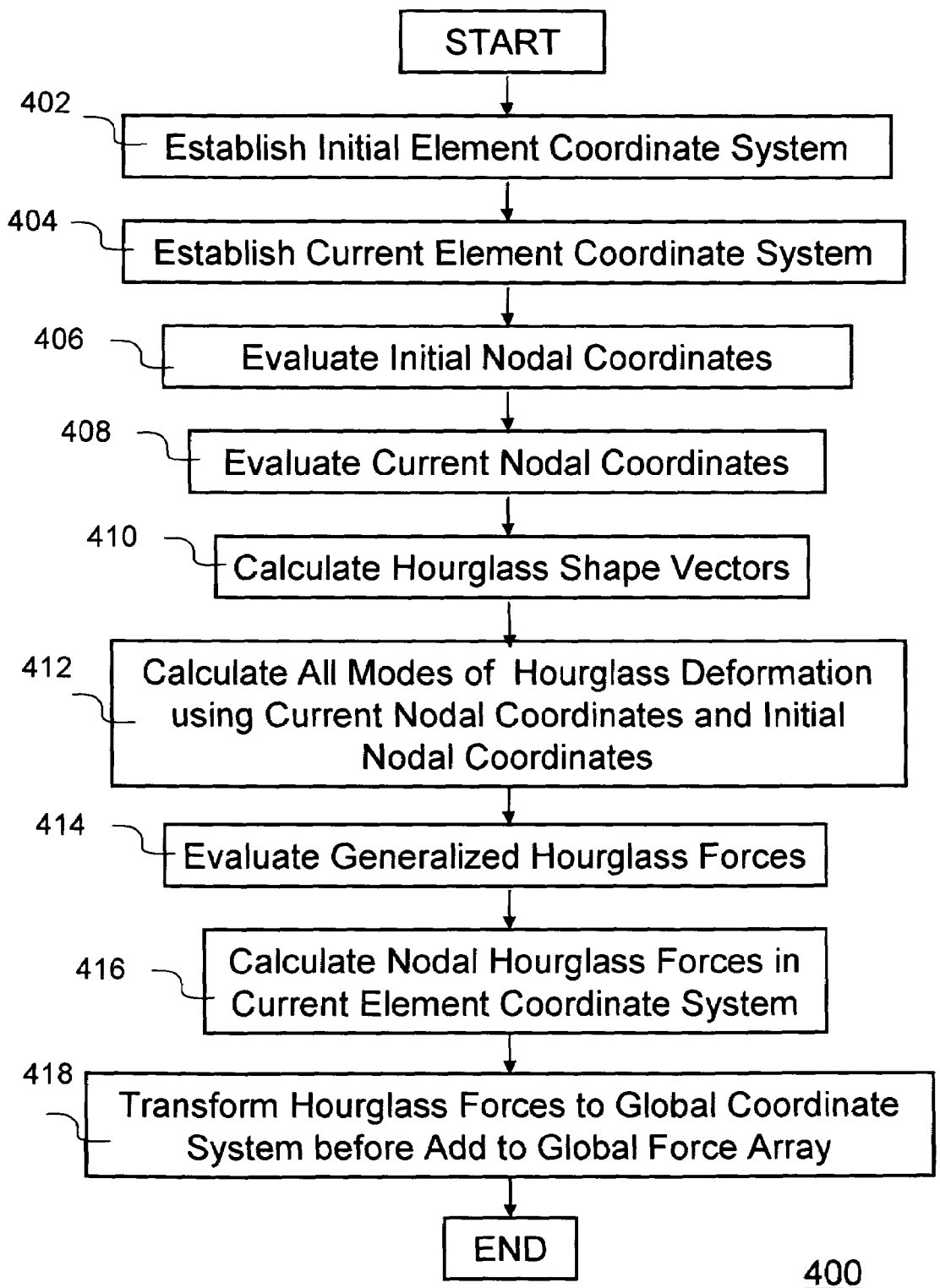
FIG. 4A is the flow chart of calculating nodal forces to counter the hourglass deformation of a solid element in the present invention.

Referring now to FIG. 4A, which shows the flow chart 400 for calculating nodal forces to counter hourglass deformation for one solid element during one solution cycle in the present invention. At 402, the initial element coordinate system is established using the global coordinates of the nodes of the initially undeformed element. At 404, the current element coordinate system is established using the global coordinates of the nodes of the currently deformed element. At 406, the initial nodal coordinates are calculated by transforming the coordinates of the nodes of the initially undeformed element from the global coordinate system to the initial element coordinate system. At 408, the current nodal coordinates are calculated by transforming the coordinates of the nodes of the currently deformed element from the global coordinate system to the current element coordinate system. At 410, the hourglass shape vectors are evaluated using the initial nodal coordinates, the derivatives of the tri-linear solid element shape functions which are also evaluated using the initial nodal coordinates, and the hourglass base vectors. At 412, the magnitude of the all modes of hourglass deformation is calculated using hourglass shape vectors, the initial nodal coordinates, and the current nodal coordinates. At 414, the generalized hourglass forces are evaluated using the magnitudes of all modes of hourglass deformation, the initial nodal coordinates, and elastic material constants of the element, such as Poisson's ratio and shear modulus.

In one embodiment, there are 12 modes of hourglass deformation in an 8-node brick element. At 416, a set of nodal forces are calculated to resist hourglass deformation using the generalized hourglass forces and the hourglass shape vectors. At 418, the set of nodal forces are transformed from the current element coordinate system to the global coordinate system and added to the global force array at the corresponding nodes.

Figure 4B:
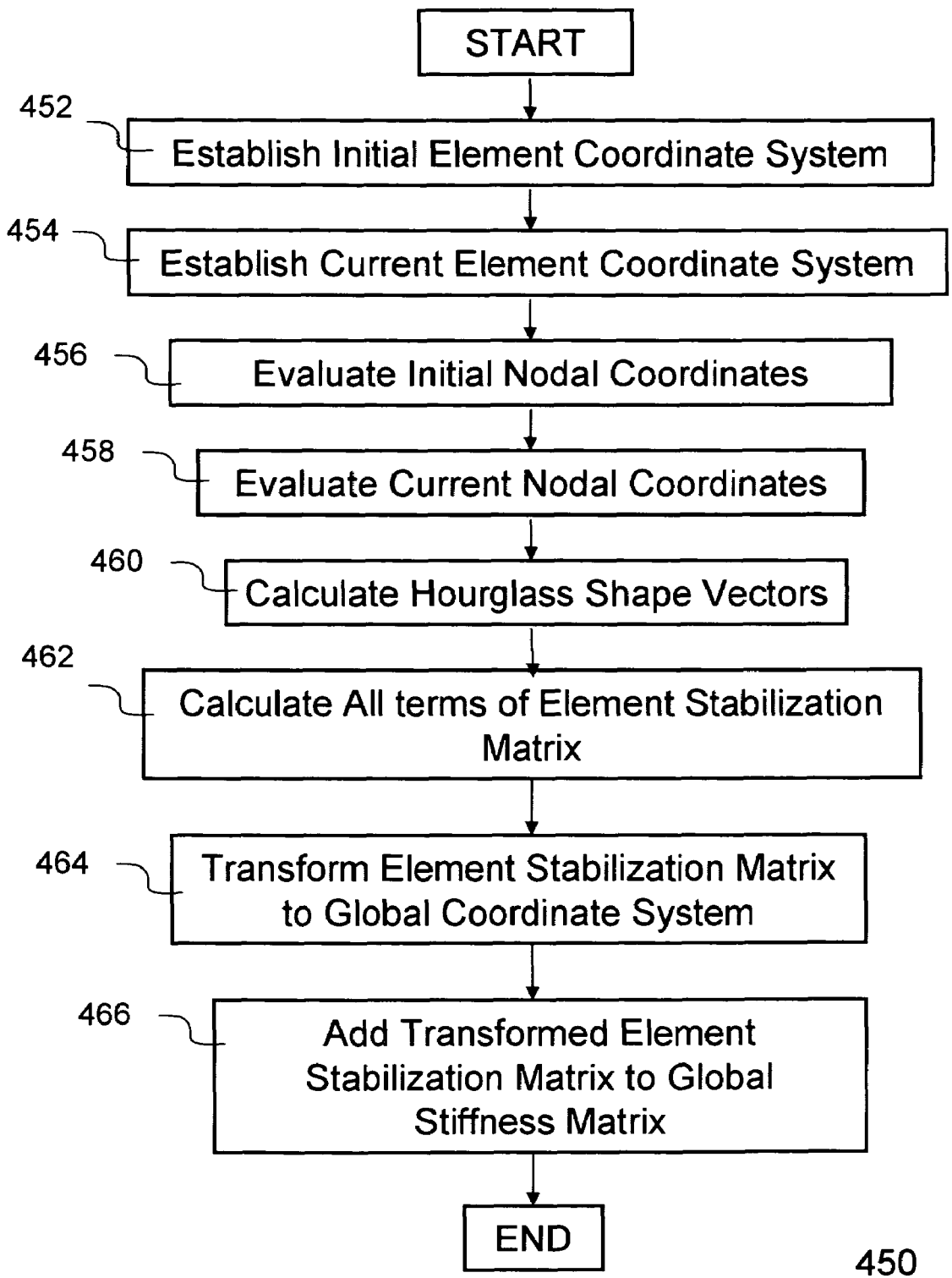
FIG. 4B is the flow chart of calculating element stabilization matrix of a solid element in the present invention.

FIG. 4B shows the flow chart 450 for calculating an element stabilization matrix that is added to the rank-deficient element stiffness matrix such that sum of the matrices is rank-sufficient. At 452, the initial element coordinate system is established using the global coordinates of the nodes of the initially undeformed element. At 454, the current element coordinate system is established using the global coordinates of the nodes of the currently deformed element. At 456, the initial nodal coordinates are calculated by transforming the coordinates of the nodes of the initially undeformed element from the global coordinate system to the initial element coordinate system. At 458, the current nodal coordinates are calculated by transforming the coordinates of the nodes of the currently deformed element from the global coordinate system to the current element coordinate system. At 460, the hourglass shape vectors are evaluated using the initial nodal coordinates, the derivatives of the tri-linear solid element shape functions which are also evaluated using the initial nodal coordinates, and the hourglass base vectors. At 462, the terms of the element stabilization matrix are calculated using the hourglass shape vectors, initial nodal coordinates, and elastic material constants for the element, such as Poisson's ratio and shear modulus. At 464, the element stabilization matrix is transformed from the initial element coordinate system to the global coordinate system. At 466, the element stabilization matrix terms are added into the global stiffness matrix. For implicit FEA, the nodal forces for resisting hourglass deformation and the stabilization matrix of the solid element are added to the global force array and global stiffness matrix, respectively. In the case of explicit FEA, only the nodal forces for resisting hourglass deformation is added to the global force array.

Figure 5E:
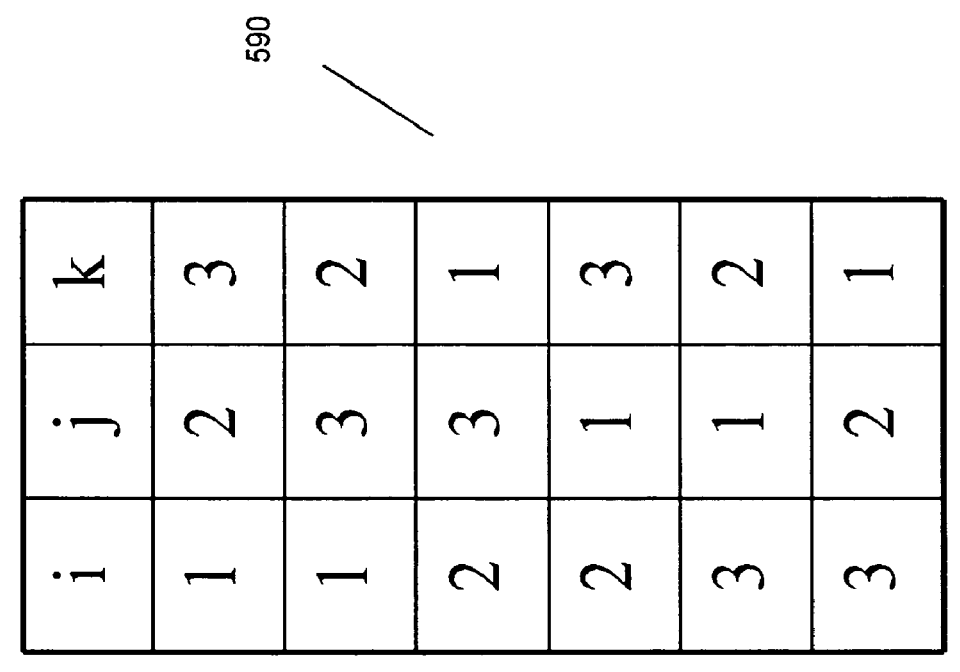

The formulas and tables listed in FIGS. 5A-5D are used for controlling hourglass deformations of an exemplary 8-node brick element of the present invention. Formula 510 in FIG. 5A is used for calculating the hourglass shape vectors $\bar{\gamma}_{\alpha J}$ for the 8-node brick element. $\Gamma_{\alpha J}$ is a term from one of the four hourglass base vectors as listed in table 580 in FIG. 5C, $\bar{X}_{iJ}$ is the initial nodal coordinate of node J, and $\bar{B}_{iJ}$ is the spatial derivative of the tri-linear shape functions with respect to the initial coordinate directions. The initial nodal coordinates have been transformed to the local element coordinate system. Similarly, $\bar{B}_{iJ}$ and $\bar{\gamma}_{\alpha J}$ are evaluated using the initial nodal coordinates transformed to the local element coordinate system. Formula 520 in FIG. 5A calculates the magnitude of the hourglass deformation $\hat{g}_{i\alpha}$ for hourglass mode $\alpha$ in spatial direction i. The current nodal coordinates of node J, $\hat{x}_{iJ}$ have been transformed to the current element coordinate system. Formulas 530 in FIG. 5B are used to evaluate the generalized forces $\bar{G}_{ii}$, $\bar{G}_{ij}$ and $\bar{G}_{i4}$. In 530, $\mu$ is the shear modulus and $\nu$ is the Poisson's ratio of the material model specified for the element. Formulas 535 in FIG. 5B are used to evaluate the $\bar{H}_{ii}$ and $\bar{H}_{ij}$ terms in Formulas 530. The $\bar{H}_{ii}$ and $\bar{H}_{ij}$ terms are evaluated from the initial nodal coordinates transformed to the initial element coordinates system $\bar{X}_{iJ}$ and the referential coordinates $\zeta_{iJ}$ listed in table 585 as shown in FIG. 5D. In Formulas 530 and 535, the subscripts i, j, and k permute based on the values listed in table 590 as shown in FIG. 5E. Formula 540 in FIG. 5B evaluates the nodal hourglass forces that resist hourglass deformation from the generalized forces and the hourglass shape vectors.

FIGS. 5F-5H are the formulas used to calculate the element stabilization matrix for an exemplary 8-node brick element. In the embodiment for the 8-node brick element, formulas 592 in FIG. 5F define the 8-element array $\gamma_j$ and the 8-element transpose array $\gamma_j^T$. The components of these arrays are $\bar{\gamma}_{\alpha J}$ calculated according to Formula 510 in FIG. 5A. Formulas 594 in FIG. 5G define the three diagonal blocks of the element stabilization matrix. Each block is an 8×8 matrix. Formula 596 in FIG. 5H define the off-diagonal blocks. These formulas for stabilization matrix are based on the initial element coordinate system. The stabilization matrix is a symmetric matrix.

Figure 6:
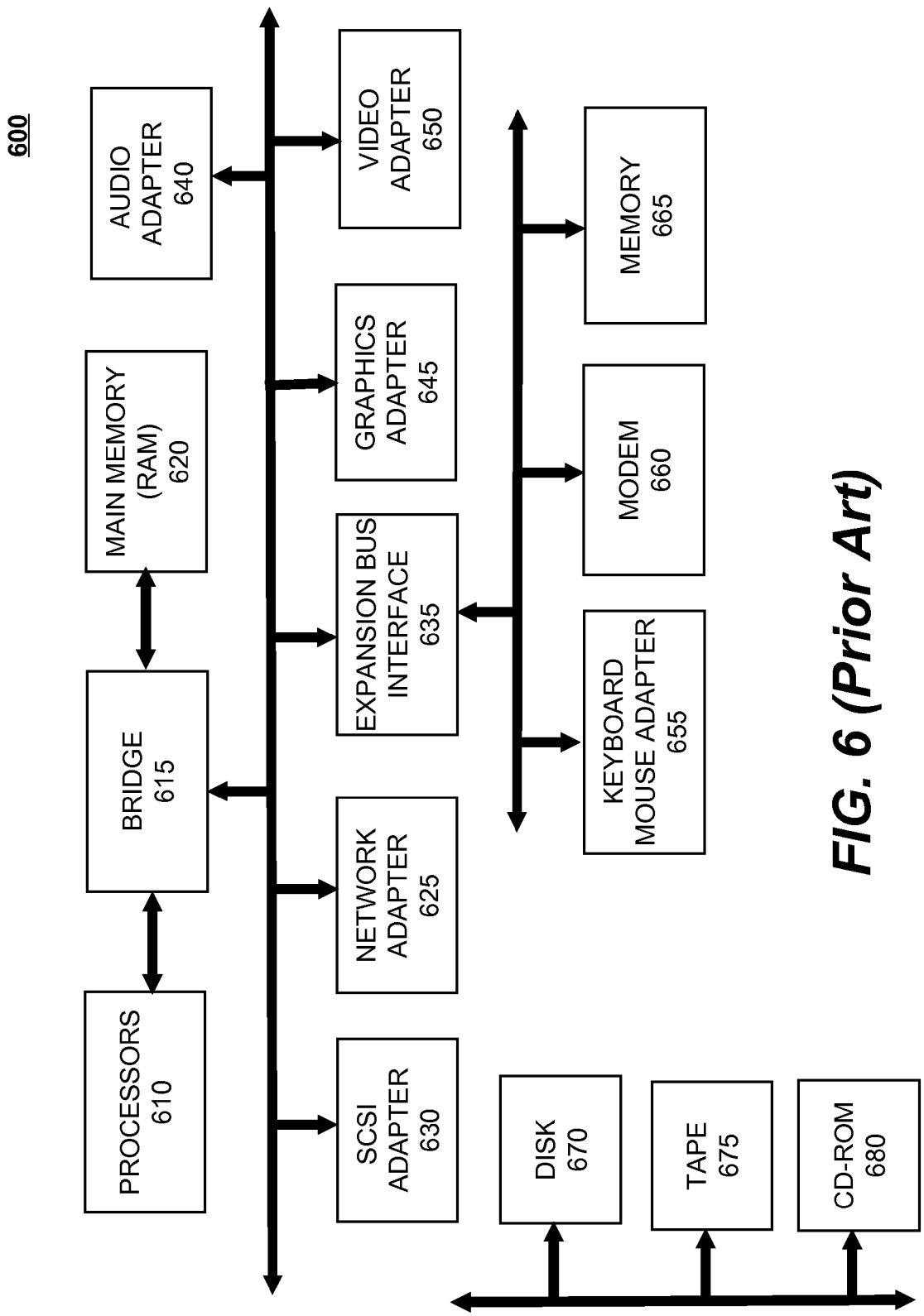
FIG. 6 depicts a block diagram of an exemplary computer, in which the present invention may be implemented.

With reference now to FIG. 6, a block diagram illustrates a computing device 600 in which the present invention may be implemented, and in which code or instructions implementing the processes of the present invention may be located. The exemplary computer system in FIG. 6 is discussed only for descriptive purposes. It should not be considered a limitation of the invention. Although the following descriptions related to a particular computer system, the concepts apply equally to other computer systems that are dissimilar to that shown in FIG. 6.

Computer system 600 includes at least one processor 610 and main random access memory (RAM) 620 connecting to a local bus 605 through a bridge 615. Additional connections to local bus 605 may be made through direct component interconnection or through add-in boards. In the depicted example, network adapter 625, small computer system interface (SCSI) adapter 630, and expansion bus interface 635 are directly connected to local bus 605. In contrast, audio adapter 640, graphics adapter 645, and video adapter 650 are connected to local bus 605 by add-in boards inserted into expansion slots. Expansion bus interface 635 provides a connection for a keyboard and mouse adapter 655, modem 660, and additional memory 665. SCSI adapter 630 provides a connection for hard disk drive 670, tape drive 675, and CD-ROM drive 680.

In order to communicate with other computer systems via a network, the computer system 600 connects to the network via network adapter 625. The network, Internet or intranet, connects multiple network devices utilizing general purpose communication lines.

Those of ordinary skill in the art will appreciate that the hardware shown in FIG. 6 may vary depending on the implementation. Other internal hardware or peripheral devices, such as flash ROM (or equivalent nonvolatile memory) or optical disk drives and the like, may be used in addition to or in lieu of the hardware depicted in FIG. 6. Also, the processes of the present invention may be applied to a multiprocessor computer system. In general, Computer system 600 is controlled and coordinated by operating system (OS) software, which performs tasks such as process scheduling, memory management, networking and I/O services. Exemplary OS includes Linux™, Microsoft Windows™.

Although an exemplary embodiment of invention has been disclosed, it will be apparent to those skilled in the art that various changes and modifications may be made to achieve the advantage of the invention. It will be obvious to those skilled in the art that some components may be substituted with another component providing same function. The appended claims cover the present invention.

I claim:

1. A method for controlling hourglass deformations of an under-integrated solid element in a finite element analysis for designing and analyzing a structural product, the method comprising:

establishing a local initial element coordinate system of the under-integrated solid element from an initial undeformed geometry of the solid element;

establishing a local current element coordinate system of the solid element from a current deformed geometry of the solid element;

calculating a set of initial nodal coordinates of the solid element in the local initial element coordinate system;

calculating a set of current nodal coordinates of the solid element in the local current element coordinate system;

evaluating a set of hourglass shape vectors of the solid element from the initial nodal coordinates;

calculating a set of hourglass deformation magnitudes of the solid element as set forth in Equation as follows:

Equation:

$$\hat{g}_{i\alpha} = \sum_{J=1}^{N} \bar{\gamma}_{\alpha J}(\hat{x}_{iJ} - \overline{X}_{iJ})$$

where:

N=total number of the corner nodes in the solid element,

J=one of the corner nodes, $\hat{g}_{i\alpha}$=one of the hourglass deformation magnitudes (spatial direction i for hourglass mode α), $\bar{\gamma}_{\alpha J}$=one of the hourglass shape vectors (node J for hourglass mode α), $\overline{X}_{iJ}$=one of the initial nodal coordinates (node J in spatial direction i of the local initial element coordinate system), $\hat{x}_{iJ}$=one of the current nodal coordinates (node J in spatial direction i of the local current element coordinate system);

evaluating a set of generalized hourglass forces from the hourglass deformation magnitudes, the local initial nodal coordinates, and material constants of the solid element;

calculating a set of counter nodal forces for controlling the hourglass deformations in the local current element coordinate system from the generalized hourglass forces and the hourglass shape vectors; and designing and analyzing a structural product by applying the set of counter nodal forces in directions opposing to the hourglass deformations such that the hourglass deformations are controlled in the finite element analysis.

2. The method as recited in claim 1, further comprising:

transforming the set of counter nodal forces from the local current element coordinate system to global coordinate system before adding to global force array.

3. The method as recited in claim 1, further comprising:

calculating all terms of an element stabilization matrix for the solid element from the hourglass shape vectors, the initial nodal coordinates, and material constants of the solid element.

4. The method as recited in claim 3, further comprising:

transforming the stabilization matrix from the local initial element coordinate system to global coordinate system before adding the terms of the stabilization matrix into global stiffness matrix.

5. The method as recited in claim 1, wherein the solid element is chosen from the group consisting of three-dimensional 8-node hexahedral element, 6-node three-dimensional pentahedral element, two-dimensional 4-node plane strain element and two-dimensional 4-node axisymmetric continuum element.

6. A software product embodied in a tangible computer readable storage medium and executing in a computing device for controlling hourglass deformations of an under-integrated solid element in a finite element analysis for designing and analyzing a structural product, the software product comprising:

program code for establishing a local initial element coordinate system of the under-integrated solid element from an initial undeformed geometry of the solid element;

program code for establishing a local current element coordinate system of the solid element from a current deformed geometry of the solid element;

program code for calculating a set of initial nodal coordinates of the solid element in the local initial element coordinate system;

program code for calculating a set of current nodal coordinates of the solid element in the local current element coordinate system;

program code for evaluating a set of hourglass shape vectors of the solid element from the initial nodal coordinates;

program code for calculating a set of hourglass deformation magnitudes of the solid element as set forth in Equation as follows:

Equation:

$$\hat{g}_{i\alpha} = \sum_{J=1}^{N} \bar{\gamma}_{\alpha J}(\hat{x}_{iJ} - \overline{X}_{iJ})$$ Equation where:

N=total number of the corner nodes in the solid element,

J=one of the corner nodes, $\hat{g}_{i\alpha}$=one of the hourglass deformation magnitudes (spatial direction i for hourglass mode α), $\bar{\gamma}_{\alpha J}$=one of the hourglass shape vectors (node J for hourglass mode α), $\overline{X}_{iJ}$=one of the initial nodal coordinates (node J in spatial direction i of the local initial element coordinate system), $\hat{x}_{iJ}$=one of the current nodal coordinates (node J in spatial direction i of the local current element coordinate system);

program code for evaluating a set of generalized hourglass forces from the hourglass deformation magnitudes, the local initial nodal coordinates, and material constants of the solid element;

program code for calculating a set of counter nodal forces for controlling the hourglass deformations in the local current element coordinate system from the generalized hourglass forces and the hourglass shape vectors; and program code for designing and analyzing a structural product by applying the set of counter nodal forces in directions opposing to the hourglass deformations such that the hourglass deformations are controlled in the finite element analysis.

7. The software product as recited in claim 6, further comprising:

program code for transforming the set of counter nodal forces from the local current element coordinate system to global coordinate system before adding to global force array.

8. The software product as recited in claim 6, further comprising:

program code for calculating all terms of an element stabilization matrix for the solid element from the hourglass shape vectors, the initial nodal coordinates, and material constants of the solid element.

9. The software product as recited in claim 8, further comprising:

program code for transforming the stabilization matrix from the local initial element coordinate system to global coordinate system before adding the terms of the stabilization matrix into global stiffness matrix.

10. The software product as recited in claim 6, wherein the solid element is chosen from the group consisting of three-dimensional 8-node hexahedral element, 6-node three-dimensional pentahedral element, two-dimensional 4-node plane strain element and two-dimensional 4-node axisymmetric continuum element.

11. A system for controlling hourglass deformations of an under-integrated solid element in a finite element analysis for designing and analyzing a structural product, the system comprising:

an I/O interface;

a data communications interface;

a memory for storing computer readable code for an application module;

at least one processor coupled to the memory, the I/O device and the data communications interface, said at least one processor executing the computer readable code in the memory to cause the application module to perform operations of:

establishing a local initial element coordinate system of the under-integrated solid element from an initial undeformed geometry of the solid element;

establishing a local current element coordinate system of the solid element from a current deformed geometry of the solid element;

calculating a set of initial nodal coordinates of the solid element in the local initial element coordinate system;

calculating a set of current nodal coordinates of the solid element in the local current element coordinate system;

evaluating a set of hourglass shape vectors of the solid element from the initial nodal coordinates;

calculating a set of hourglass deformation magnitudes of the solid element as set forth in Equation as follows:

Equation:

$$\hat{g}_{i\alpha} = \sum_{J=1}^{N} \bar{\gamma}_{\alpha J}(\hat{x}_{iJ} - \overline{X}_{iJ})$$

where:

N=total number of the corner nodes in the solid element,

J=one of the corner nodes, $\hat{g}_{i\alpha}$=one of the hourglass deformation magnitudes (spatial direction i for hourglass mode α), $\bar{\gamma}_{\alpha J}$=one of the hourglass shape vectors (node J for hourglass mode α), $\overline{X}_{iJ}$=one of the initial nodal coordinates (node J in spatial direction i of the local initial element coordinate system), $\hat{x}_{iJ}$=one of the current nodal coordinates (node J in spatial direction i of the local current element coordinate system);

evaluating a set of generalized hourglass forces from the hourglass deformation magnitudes, the local initial nodal coordinates, and material constants of the solid element;

calculating a set of counter nodal forces for controlling the hourglass deformations in the local current element coordinate system from the generalized hourglass forces and the hourglass shape vectors; and designing and analyzing a structural product by applying the set of counter nodal forces in directions opposing to the hourglass deformations such that the hourglass deformations are controlled in the finite element analysis.

12. The system of claim 11, further comprising operations of:

transforming the set of counter nodal forces from the local current element coordinate system to global coordinate system before adding to global force array.

13. The system of claim 11, further comprising operations of:

calculating all terms of an element stabilization matrix for the solid element from the hourglass shape vectors, the initial nodal coordinates, and material constants of the solid element.

14. The system of claim 13, further comprising operations of:

transforming the stabilization matrix from the local initial element coordinate system to global coordinate system before adding the terms of the stabilization matrix into global stiffness matrix.

15. The system of claim 11, wherein the solid element is chosen from the group consisting of three-dimensional 8-node hexahedral element, 6-node three-dimensional pentahedral element, two-dimensional 4-node plane strain element and two-dimensional 4-node axisymmetric continuum element.

* * * * *